United States Patent
Allen et al.

(10) Patent No.: US 7,089,511 B2
(45) Date of Patent: Aug. 8, 2006

(54) FRAMEWORK FOR HIERARCHICAL VLSI DESIGN

(75) Inventors: Robert John Allen, Jericho, VT (US);
Ulrich Finkler, Mahopac, NY (US);
Mark A. Lavin, Katonah, NY (US);
Robert T. Sayah, Verbank, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/733,210

(22) Filed: Dec. 10, 2003

(65) Prior Publication Data

US 2005/0132320 A1   Jun. 16, 2005

(51) Int. Cl.
*G06F 17/50* (2006.01)
(52) U.S. Cl. .............................. 716/3; 716/10; 716/11; 716/18
(58) Field of Classification Search .................. 716/1, 716/4–5, 7–11, 18, 12–13
See application file for complete search history.

(56) References Cited

U.S. PATENT DOCUMENTS

| 5,481,473 | A | | 1/1996 | Kim et al. ................... 716/5 |
| 5,519,628 | A | * | 5/1996 | Russell et al. ............... 716/10 |
| 5,696,693 | A | * | 12/1997 | Aubel et al. .................. 716/8 |
| 6,263,480 | B1 | * | 7/2001 | Bartels et al. ............... 716/13 |
| 6,275,974 | B1 | | 8/2001 | Bartels et al. ............... 716/13 |
| 6,473,881 | B1 | | 10/2002 | Lehner et al. ................. 716/2 |
| 6,505,323 | B1 | * | 1/2003 | Lipton et al. .................. 716/3 |
| 2004/0010759 | A1 | * | 1/2004 | Kale et al. .................... 716/1 |
| 2004/0123260 | A1 | * | 6/2004 | Teig et al. .................... 716/7 |

* cited by examiner

*Primary Examiner*—Paul Dinh
(74) *Attorney, Agent, or Firm*—F. Chau & Associates, LLC

(57) ABSTRACT

A method for hierarchical very large scale integration design comprises representing a structure of the hierarchical very large scale integrated design as a graph comprising design objects. The method further comprises specifying a transformation behavior applied to the design objects, and processing, top-down, the graph to perform the transformation on the hierarchical very large scale integrated design.

27 Claims, 9 Drawing Sheets

INSTANCE LC1              INSTANCE LC2

FRAMEWORK FOR HIERARCHICAL VLSI DESIGN

BACKGROUND OF THE INVENTION

1. Field of the Invention

The present invention relates to semiconductor design, and more particularly to a hierarchical system and method for VLSI design.

2. Discussion of Related Art

The design of a Very Large Scale Integration (VLSI) layouts comprises manufacturing layout verification, layout modifications, and verification of design conventions.

Layout verification involves the checking a layout against the design rules (DRC) and a comparison of extracted circuitry against a schematic netlist (LVS).

Layout modifications enhance timing, reliability, and/or manufacturability. A modification is an alteration of the layout without alteration of the logical behavior of the circuitry. Modification steps includes cheesing, i.e., creating patterns of holes, in wide metal areas and filling of spaces to provide uniform density. Modification includes adding redundant vias, and optical proximity correction and other resolution enhancement techniques. Layout modification may be constrained to preserve the existing hierarchy. If not, layout modification has the freedom to exploit rearranging the hierarchy. The degree of freedom available depends on the application.

Methodology checks verify design conventions, e.g., labeling standards for the layout or the observation of contact zones of macros.

An engine for VLSI layout processing has to provide functionality that implements layout verification and modification tasks efficiently. Two mechanisms help in this task.

The hierarchical representation of the VLSI design avoids redundant computations and independent subproblems allow parallel processing.

A VLSI layout processing task, called VLPT, is a composition of basic operations, e.g., expand and shrink, on VLSI design objects, e.g., shapes or levels. Typically the description of a VLPT is given in a high level programming language. The high level language operates primarily on pointsets, attributes, hierarchical structure and concepts derived from interaction principles, e.g., nets based on electrical connectivity (see FIG. 1).

Therefore, a need exists for a system and method for automated hierarchical VLSI design having improved efficiency.

SUMMARY OF THE INVENTION

According to an embodiment of the present invention, a method for hierarchical very large scale integration design comprises representing a structure of the hierarchical very large scale integrated design as a graph comprising design objects. The method further comprises specifying a transformation behavior applied to the design objects, and processing, top-down, the graph to perform the transformation on the hierarchical very large scale integrated design.

The processing further comprises searching for an isomorphic structure.

The graph describes a plurality of scopes. The graph is based on a pointset interaction between structures of the hierarchical very large scale integration design. The graph is based on symmetry groups between structures of the hierarchical very large scale integration design, wherein the graph represents a circuit substructure.

An attribute is attached to a design object, the attribute having a user-defined mapping between an attribute transformation and a design object transformation.

Processing, top-down, comprises transferring information from a child graph to a parent graph, wherein a node in the parent graph represent an instance of the child graph.

Processing, top-down, the graph comprises resolving boundary conditions, recursively, by adjusting a parent cell, beginning with a root cell of the graph. Each cell is represented by a plurality of connected least enclosing orthogonal pointsets. The method further comprises determining an interaction between the least enclosing orthogonal pointsets, and determining a decomposition of the cell according to the interaction. Processing, top-down, further comprises cloning by expression using a result of the decomposition to produce a cell definition.

Representing the structure of the hierarchical very large scale integration design as the graph comprising design objects further comprises determining a plurality of scopes, wherein each scope comprises an internal node and a leaf node.

According to an embodiment of the present invention, a method for processing a design graph comprises providing a design, specifying a substructure to be determined within the design as a graph, and deriving design objects from the design. The method further comprises mapping design objects to nodes of the graph by using a rail and junction decomposition to capture a pointset topology comprising edges, mapping relationships between design objects to the edges, and searching the graph for a structure.

Searching comprises searching the graph for an isomorphic substructure known to be an instance of the structure.

Searching comprises searching the graph for a geometric substructure according to a pointset interaction of the graph having mapped design objects and relationships.

According to an embodiment of the present invention, a program storage device is provided readable by machine, tangibly embodying a program of instructions executable by the machine to perform method steps for hierarchical very large scale integration design. The method steps comprising representing a structure of the hierarchical very large scale integrated design as a graph comprising design objects, specifying a transformation behavior applied to the design objects, and processing, top-down, the graph to perform the transformation on the hierarchical very large scale integrated design.

BRIEF DESCRIPTION OF THE DRAWINGS

Preferred embodiments of the present invention will be described below in more detail, with reference to the accompanying drawings.

DETAILED DESCRIPTION OF PREFERRED EMBODIMENTS

A framework of methods for programmable processing of VLSI design information, e.g., netlists and layouts, comprises layout verification and layout modification methods, e.g., for manufacturability or migration.

The framework is based on elements. A top-down hierarchical processing element, e.g., that determines context before processing VLSI cells, limits peaks in temporary resource use. The top-down hierarchical processing adapts to the degree of design nesting by balancing flat processing techniques with nesting techniques.

A hierarchical graph representation element specifies the transformation applied to VLSI design objects, e.g., structural properties of VLSI. For each transformation of a design object, a user can specify a transformation for an attached attribute, wherein attributes are attached to design objects.

A flexible framework element for device and topology recognition describes devices and other structures through graph definitions based on pointset interactions and symmetry groups.

It is to be understood that the present invention may be implemented in various forms of hardware, software, firmware, special purpose processors, or a combination thereof. In one embodiment, the present invention may be implemented in software as an application program tangibly embodied on a program storage device. The application program may be uploaded to, and executed by, a machine comprising any suitable architecture.

Figure 1:
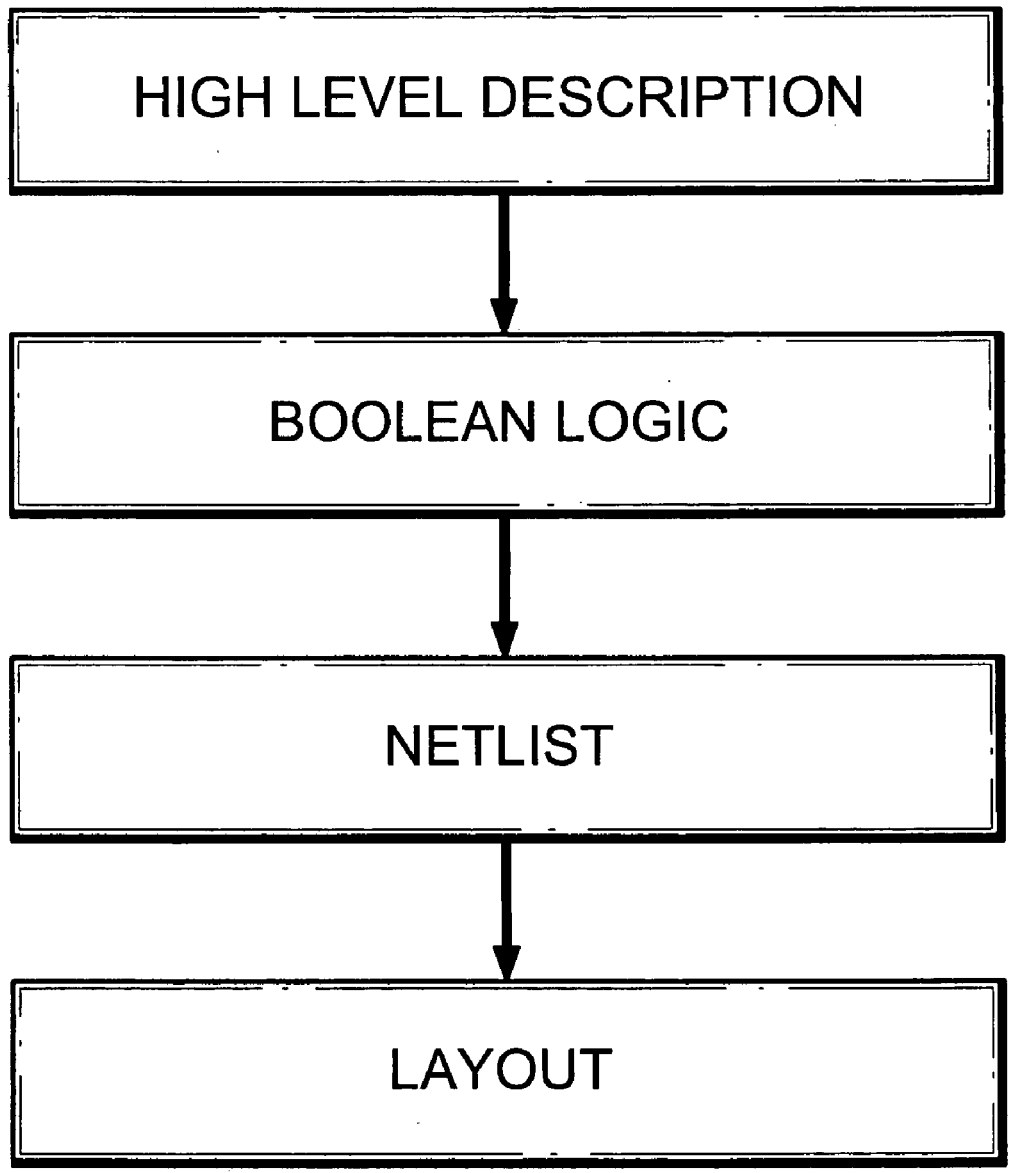
FIG. 1 is a diagram of VLSI design stages.
Figure 2:
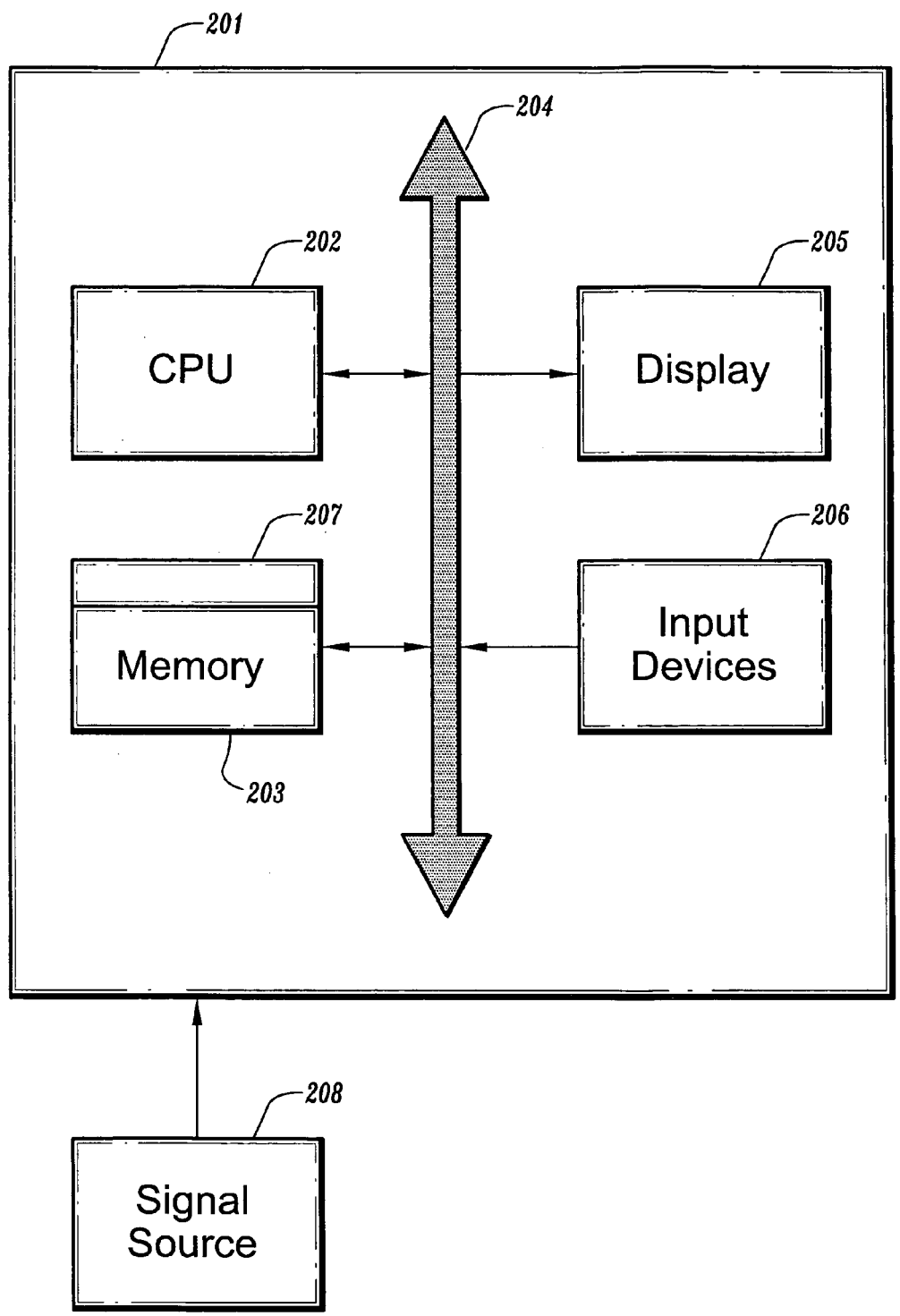
FIG. 2 is a diagram of a system according to an embodiment of the present invention.

Referring to FIG. 2, according to an embodiment of the present invention, a computer system 201 for implementing the present invention can comprise, inter alia, a central processing unit (CPU) 202, a memory 203, and an input/output (I/O) interface 204. The computer system 201 is generally coupled through the I/O interface 204 to a display 205 and various input devices 206 such as a mouse and keyboard. The support circuits can include circuits such as cache, power supplies, clock circuits, and a communications bus. The memory 203 can include random access memory (RAM), read only memory (ROM), disk drive, tape drive, etc., or a combination thereof. The present invention can be implemented as a routine 207 that is stored in memory 203 and executed by the CPU 202 to process the signal from the signal source 208. As such, the computer system 201 is a general-purpose computer system that becomes a specific purpose computer system when executing the routine 207 of the present invention.

The computer platform 201 also includes an operating system and microinstruction code. The various processes and functions described herein may either be part of the microinstruction code or part of the application program (or a combination thereof), which is executed via the operating system. In addition, various other peripheral devices may be connected to the computer platform such as an additional data storage device and a printing device.

It is to be further understood that, because some of the constituent system components and method steps depicted in the accompanying figures may be implemented in software, the actual connections between the system components (or the process steps) may differ depending upon the manner in which the present invention is programmed. Given the teachings of the present invention provided herein, one of ordinary skill in the related art will be able to contemplate these and similar implementations or configurations of the present invention.

The framework for VLSI processing implements nested processing concepts, processing and representation of the hierarchy, and attribute and device handling.

Figure 3:
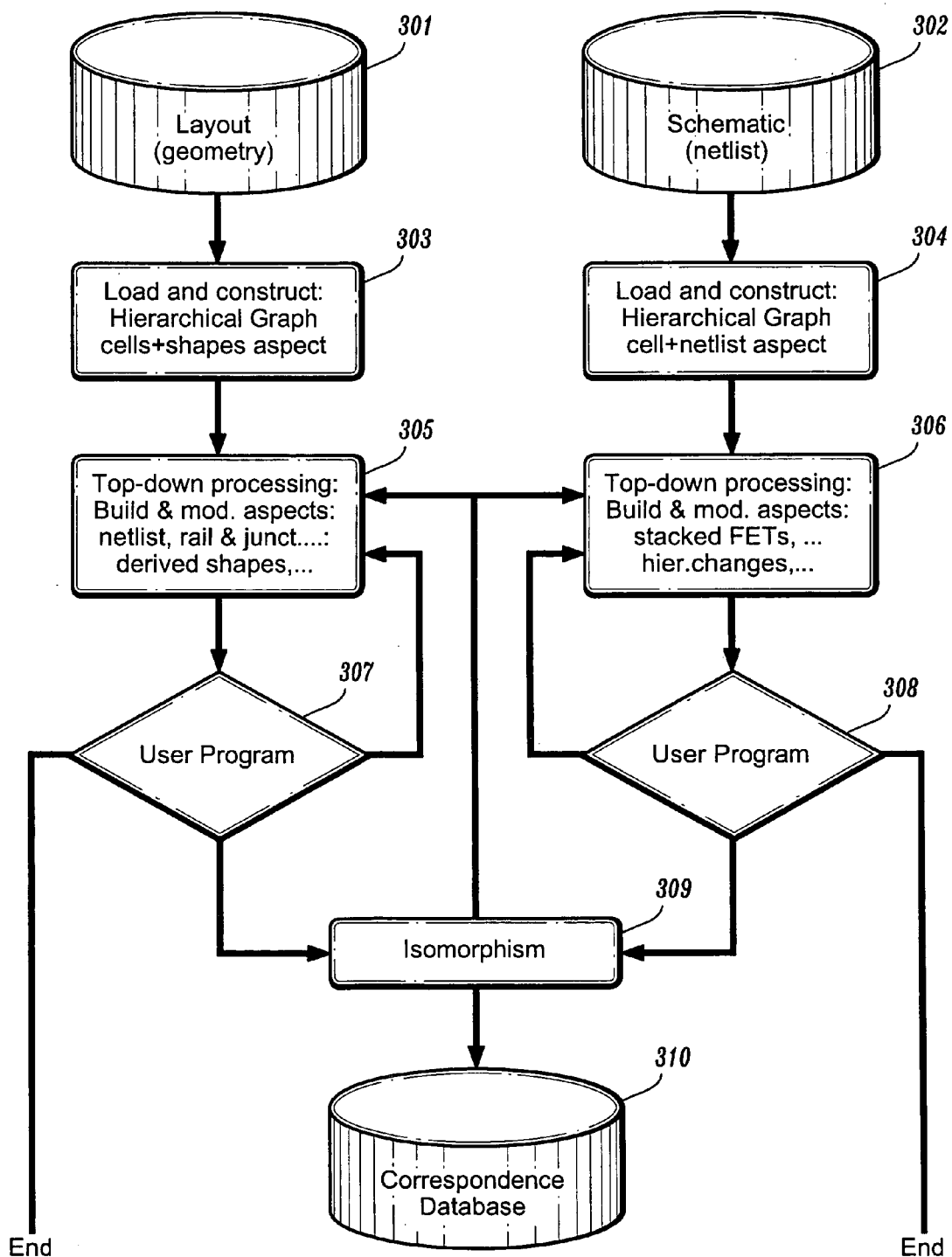
FIG. 3 is a flowchart of a method according to an embodiment of the present invention.

FIG. 3 shows a method of loading a design into a data structure over a top-down processing to build a data model and perform other computations. A database 301/302 provides a layout or schematic. A hierarchical graph is constructed according to the layout or schematic 303/304. A top-down processing of the hierarchical graph is performed 305/306. A user program can be implemented 307/308 for a desired task. The isomorphism of the processed hierarchical graph is performed 309 and the processed hierarchical graph is stored in a correspondence database 310.

A top-down hierarchy processing comprises cloning by expressions. Traditional hierarchy processing schemes operate bottom-up, processing leaf cells of a directed acyclic graph (DAG) first. According to an embodiment of the present invention, a computation framework uses top-down processing to take advantage of knowledge about higher level interactions, e.g., the context of a VLSI semiconductor cell.

The top-down processing maintains the constraint that a cell does not need knowledge of the content of its instantiation contexts. Resolving of boundary conditions created by interactions, described herein, is performed such that adjustments are performed in the instantiating cell (parent) rather than in the instantiated cell (child).

Instances are represented by connected pointsets comprising a number of rectangles that enclose the content, called least enclosing orthogonal pointsets (LEOP). There is either one enclosing pointset per cell or one per level of a cell. The processing starts in the root cell of the hierarchy, i.e., the node in the DAG without parents.

Figure 4C:
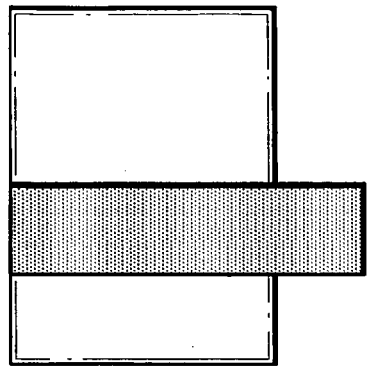
FIGS. 4A–C are illustrations of cell instances having different interactions according to an embodiment of the present invention.
Figure 4B:
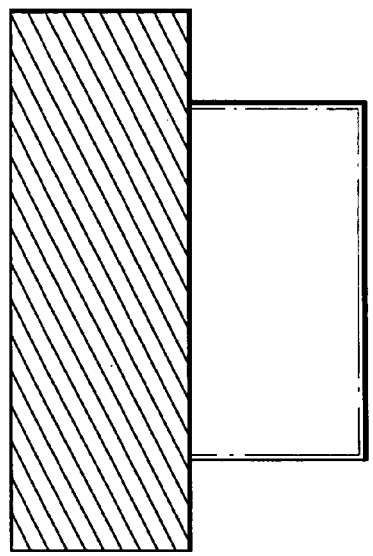
Figure 4D:
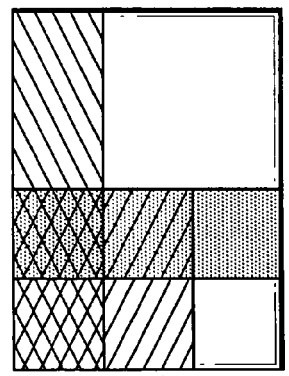
FIG. 4D is an illustration of a cell merging the instances of FIGS. 4A–C.

Consider several instances $A_1 \ldots A_n$ of a cell in a cell P. The interactions of the instance-LEOPs of $A_1 \ldots A_n$ with native design objects and other instance-LEOPs in P are captured in a decomposition of the area of each instance in a covered and an uncovered part (see FIG. 4A–D). Combining the partitions of the instances provides a partitioning of the area of A into multiple pieces (see FIG. 4D). Each component of this decomposition has a unique set of interactions.

Interactions of instance-LEOPs of A are gathered up to a threshold and scheduled for processing. Thus, by the time processing of actual content of A occurs, the character of its interactions is known. This allows optimization of the computation for highly nested or mostly flat scenarios or cases in between these extremes described herein.

Furthermore, the expression of interactions as an area decomposition directly provides the needed information to create clones of cells through differential expressions.

Figure 4A:
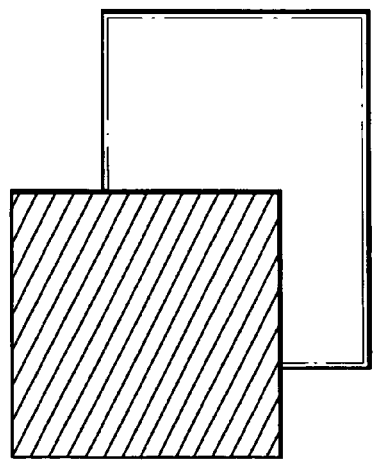

FIG. 4A–3C show three instances of a cell as an example. Each of the instances has a different area masked by a LEOP as unique for the instance due to interacting design objects. The resulting decomposition of the cell area contains one rectangle that is unique in all instances such that no nested results are needed. The remaining decomposition indicates for which instances which subarea may remain nested in the result shown in FIG. 4D. Each instance obtains the nested result with a differential modifier that excludes the unique part for this instance.

The results for the instances of a cell A of a computation on level L fall into equivalence classes $a_1 \ldots a_n$. Let $a_1$ be the result for an instance that does not experience any interaction. Then results that differ only in a particular subregion, e.g., the boundary of A, can be expressed as cell definitions through expressions. These expressions are composed beginning with the cell being cloned, i.e., A. Operations based on polygonal or rectangular regions can be applied, for example:

Subtraction A'=A−R(L): The content of A without the pointsets on level L that are covered by the polygonal region R.

Subtraction A'=A−p(A): The content of A without the pointset p that is part of the definition of A.

Addition A'=A+R(L,B,t): The content of A and the pointsets on level L in cell B covered by region R, such that B is placed in the coordinate system of A by transformation t.

Addition A'=A+p(B,t): The content of A and the pointset p from the definition of B, such that B is placed in the coordinate system of A by transformation t.

Addition A'=A+p(L,t): The content of A and the pointset p on level L placed into the coordinate system of A through transformation A, i.e., adding a native object to A.

Figure 5B:
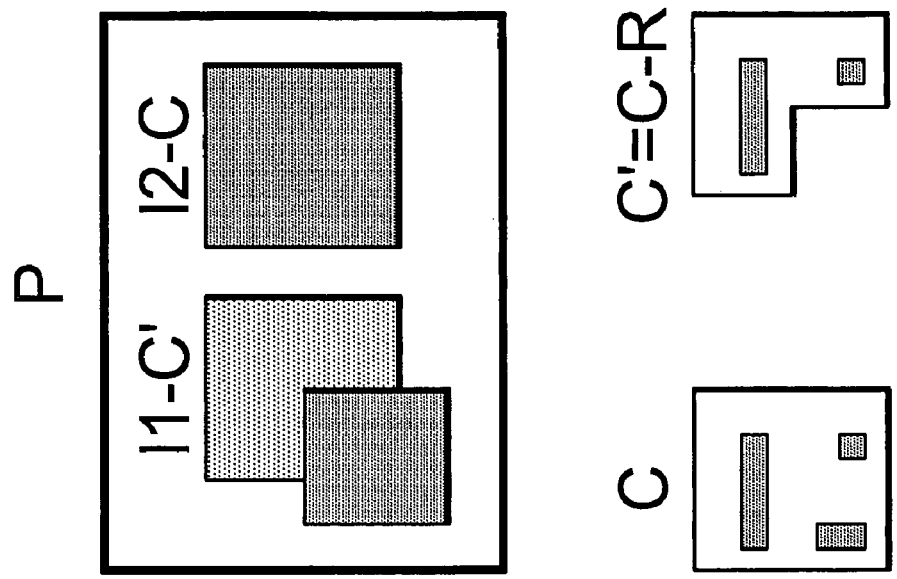
FIGS. 5A–B illustrate a change in cell aspect according to an embodiment of the present invention.
Figure 5A:
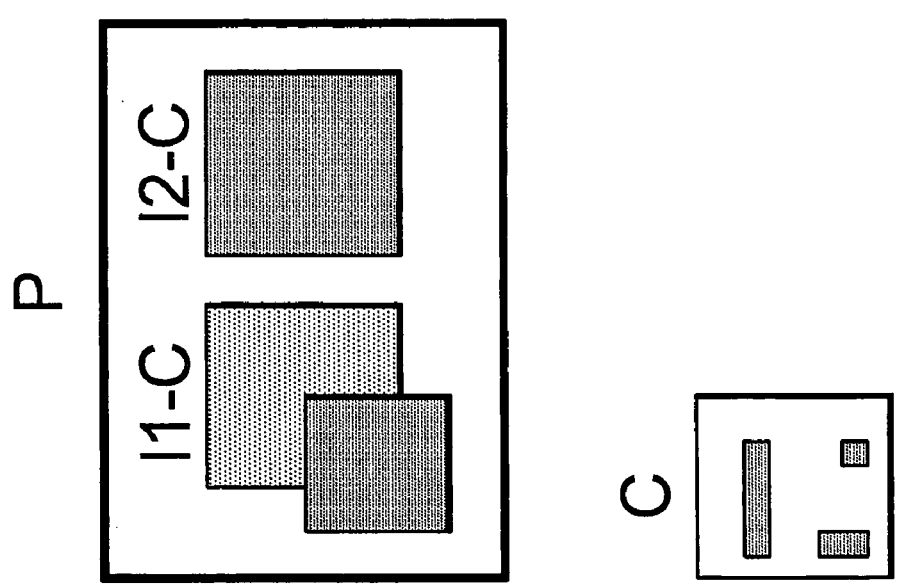

FIGS. 5A–B show changes in cell aspect of a hierarchical graph through cloning by expression. Initial cell P comprises two instances of C with different contexts. Processing brings content to instance I1-C into the parent cell due to another object overlapping I1-C in region R. The cell C' which comprises C without the content of region R is created implicitly through the definition C−R.

Figure 6:
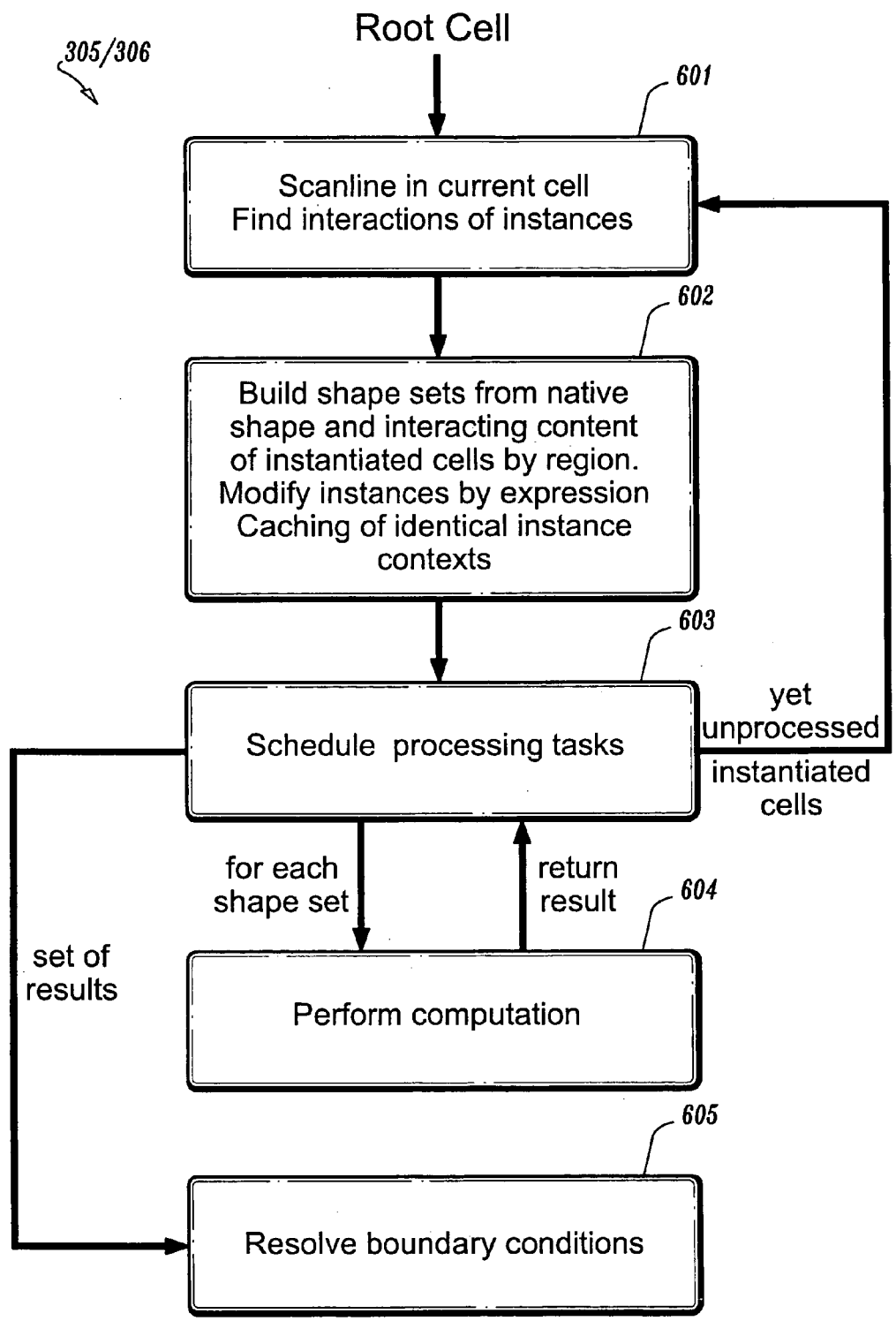
FIG. 6 is a flowchart of a method according to an embodiment of the present invention.

FIG. 6 shows a method of top down processing in a variant based on scanline processing. A current cell is analyzed to determine interactions of instances 601. Shape sets are built from native shapes and interaction content of instantiated cells by regions. Instances are modified by expression and identical instance contexts are cached, and independent sub-jobs are determined 602. A schedule of processing tasks, or sub-jobs, is reviewed to determine whether all cells have been analyzed 603. For each shape set a computation is performed 604, e.g., expanding or shrinking. Upon processing all cells and shape sets, the boundary conditions are resolved 605.

The parent-child relationships in a VLSI design hierarchy form an acyclic directed graph. There are additional relationships in a VLSI layout that are mapped to graphs. For example, a graph based on electrical connectivity and device extraction corresponds to the extracted netlist.

The concept (and a corresponding implementation) of a data structure called hierarchical graph captures both the parent-child relationships in addition to other relationships like electrical connectivity. This concept is applicable on several levels of abstraction of a VLSI design.

Maintaining a hierarchical graph reflecting interactions on different levels of abstraction enables incremental processing of changing VLSI designs for connectivity or relationship based operations. For a distance based determination, e.g., a distance check, it is possible to determine an area of impact for a change in a VLSI design and to establish the new result based on the outcome of the determination on the unaltered layout and a redetermination in the area of impact of the changed input. This is not possible for connectivity based operations.

For example, the extraction of nets based on electrical connectivity does not have a limited area of impact. Removing a single shape may or may not cause an open. To determine whether the net remains connected or not, the connectivity of the net needs to be maintained. The hierarchical graph described in herein by way of example maintains the needed information to make this decision by a graph traversal compared to a reextraction of the connectivity. It covers the necessary information to perform incremental operations based on electrical connectivity.

The capability to load the persistent representation of the outcome of a previous run into the engine and to get full access the engines capabilities for this reloaded state important for any form of incremental processing. This property also enables interactive applications and reports.

A hierarchical graph comprises multiple scopes. A scope is an undirected graph with two types of nodes. Internal nodes represent an instance of another scope. Leaf nodes do not represent another scope. Edges that connect nodes within one scope are called horizontal. The adjacency between an edge and a leaf node is equivalent to the adjacency between edge and node in an undirected graph. The adjacency between an edge and an internal node carries additional properties.

The adjacency between an edge e and a node v in a hierarchical graph is called a stub. A stub to a leaf node is a pure horizontal stub. A stub to an internal node v has a horizontal component, e.g., the fact that the edge ends in the node v that resides in the same scope as the edge e. A stub to an internal node has a vertical component, which is a vertical edge that connects the horizontal component of the stub ending in v in the parent scope with a node w in the scope represented by v. Note that the adjacency between the vertical edge and the node w in the child scope is itself a stub, which has its own vertical component if w is an internal node in its scope. Thus, the chain of vertical components ends once a leaf node is found or once another criterion controlling connection depth terminates the chain, e.g., if only a certain level of detail is desired.

Figure 7A:
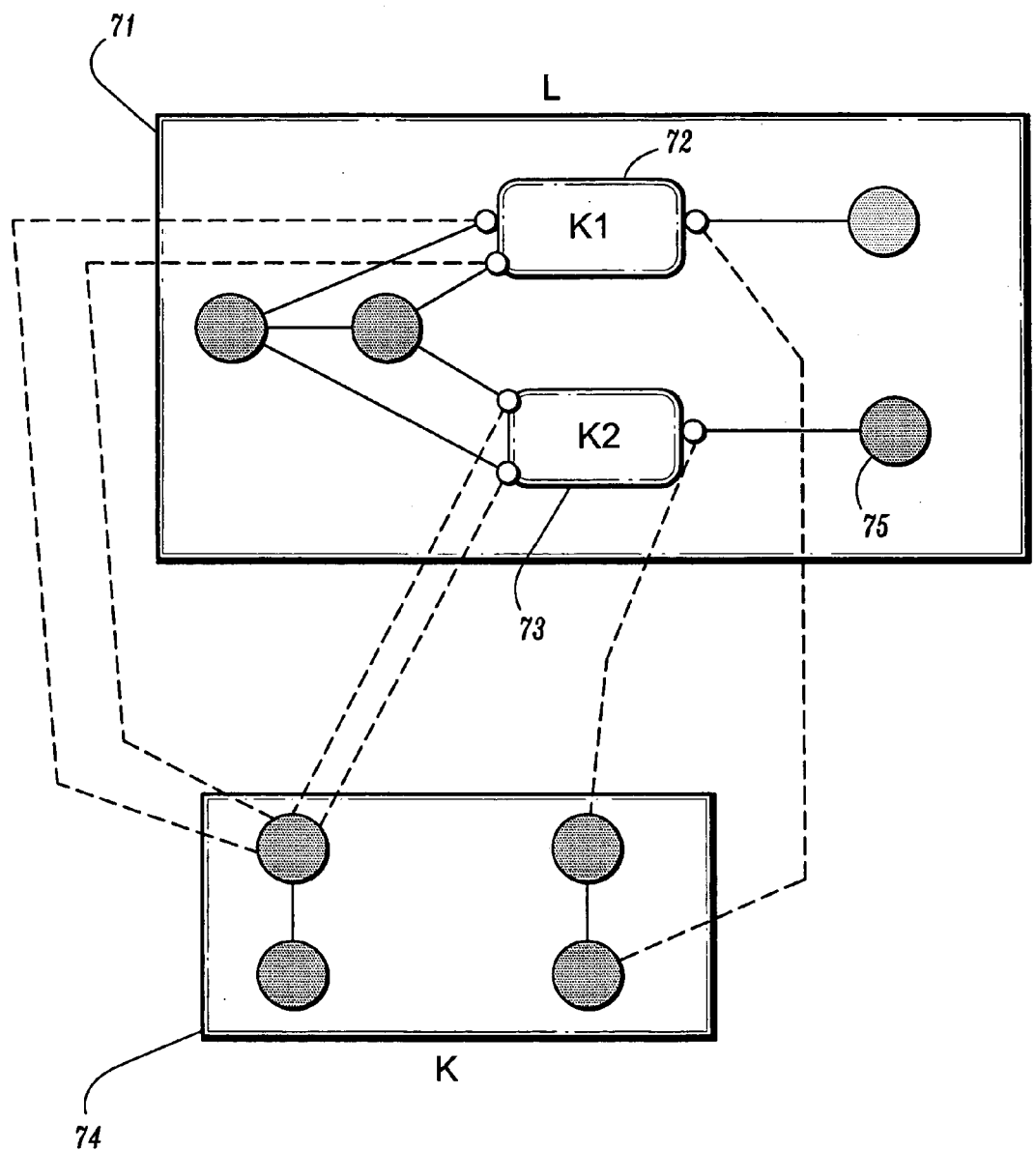
FIG. 7A is an illustration of a hierarchical graph according to an embodiment of the present invention.

FIG. 7A shows an example with two levels of hierarchy. A scope L 71 comprising two instances of scope K, e.g., K1 72 and K2 73. Rectangles represent two cells L 71 and K 74. Rounded rectangles represent two instances of K 72 and 73, colored circles, e.g., 75, represent leaf objects. Horizontal edges are solid lines, vertical edges are shown as a combination of small circles and dashed lines.

An example of an application of the concept of hierarchical graphs as a default decomposition of a VLSI design is the basis of the computation framework. It implements the following levels of abstraction:

Cells and nets: This level of abstraction provides the view of an extracted netlist, nets are formed by rules of electrical connectivity. A native net is formed by electrical connectivity interactions within a single cell, these are interactions between pointsets on different levels but within the same cell. A hierarchical net is formed by electrical connectivity of native nets in a cell P with native nets in its descendants. A flat net is formed by electrical connectivity of an instance of a native net to native nets in its ancestors and descendants. The latter two types of nets are formed by interactions between shapes in different cells.

Maximum connected pointsets: A native net consists out of maximum connected pointsets within a level.

Rails and junctions: A maximum connected pointset is partitioned into rails and junctions. Rails reflect wire like rectangles, described herein, and junctions reflect everything else.

Convex disjoint pointsets: While rails are already convex pointsets, junctions are decomposed into convex pointsets.

The interactions between the different levels of abstraction and the objects therein define the vertical and horizontal edges, respectively. A detailed example of this application of the concept is discussed herein.

Attributes are properties attached to point sets. Since relationships between and operations on point sets are allowed, these relationships and operations are needed to have equivalents for the attached attributes to obtain a consistent definition of H. The mapping of geometry and hierarchy transformation to attribute transformations is called attribute semantics.

Different types of attributes can be distinguished: attributes with known estimates and attributes with unknown semantics.

Referring to attributes with known semantics; for such attributes the behavior under operations on the pointset and under changes of the representation of the pointset, e.g., the hierarchical structure, is known. An example for an attribute with known semantics are net names attached to pointsets in a given hierarchical representation. For the change from GL/1 to GDS2 it is known how to translate a net name. For other operations, e.g., altering of shapes (keep them) and explosion of an instance (connected components obtain the name highest in the hierarchy) the behavior is also known.

Referring to attributes with unknown semantics; for these attributes the behavior is at least partially unknown. For example, there may be no GDS2 counterpart for a particular GL/1 attribute opcode.

In this case a default policy is needed, e.g., to keep attributes and union attribute lists. Another default policy would be to drop attributes with unknown semantics if anything else than the identity operation is performed on the pointset.

A simple translation of the representation encapsulates the original binary form together with a code that identifies the original format (e.g., GL/1) such that a translation into GDS2 and back to GL/1 does not cause a loss of information.

An example configuration section for an attribute is given below. This can be specified in a configuration file or through a GUI with multiple choice forms. The transform DisAllow causes the program to fail compilation or execution if an object with a netname attribute is moved to a child. It also prohibits the engine from optimization needing such an action.

```
attribute 'netname' {
    value(string);
    encoding(format=GL/1,code=F122);
    encoding(format=GDS,code=...);
    policy(action=MoveToParent,
    transform=ConcatenateWithInstance);
    policy(action=MoveToChild, transform=DisAllow);
    policy(action=MergePointsets, transform=KeepHighest);
    policy(action=SplitPointset, transform=CopyToAll); ... };
```

Note that any indexing scheme or mapping derived from the actual design hierarchy may be interpreted as a set of attributes in the most general sense, e.g., the graph reflecting electrical connectivity.

If all geometric operations and hierarchy transformations are classified into a few classes with respect to their impact on attributes and a selection of attribute handling options are offered for each of these classes, users may specify semantics of attributes on a by attribute basis through a configuration file.

Situations can arise where it is interesting to extract the topological structure out of the geometry. One example is device recognition, another the detection of loops in electrical nets.

In current layout verification systems there is a set of predefined device types that correspond to restricted geometric configurations, e.g., the gate and diffusion shapes of a field effect transistor. Other forms of topological extraction that are not explicitly supported are handled by partial net building and filtering or similar indirect methods.

The mapping of pointsets, pointset topologies and relationships within a VLSI design to hierarchical graphs opens the possibility to use graph based techniques for device and subcircuit recognition. Subcircuit recognition is related to finding subgraph isomorphism and this computationally infeasible in the general case. But many interesting substructures, e.g., devices or certain wiring configurations or ESD circuits are small in size and thus tractable with this approach.

A substructure that is to be found is specified as a graph. Design objects and derived objects like pointsets, rails or junctions are mapped to nodes, relationships between the objects are mapped to edges.

The subgraph isomorphism search in a graph starts by looking for small seed structures, e.g., the pointset interaction forming the gate of a CMOS device. Then they investigate the environment of such a seed structure for refined criteria in a recursive fashion to decide whether or not the seed structure is really embedded in an instance of the desired structure.

The finding of geometric substructures operates in an analogous fashion. Pointset interactions are found that correspond to the graph components of the seed structure as defined by the mapping between geometry and graph elements. The environment of matching derived pointsets is scanned for pointset interactions matching the refined graph criteria in a recursive fashion.

The elements defined above are implementing in a processing framework for VLPTs.

The input to a VLSI Layout Processing Task is a hierarchy of design objects, in the following considered to be an element of the set H of possible hierarchies of design objects.

A design object is a geometric object with associated attributes. Attributes may be strings, numerical values, matrices or a binary representation of an externally defined type.

A cell defines a coordinate space and a set of basic design elements and instances of other cells in this coordinate space. An instance carries a coordinate transform that places a copy of the instantiated cell (child cell) into the coordinate space of the instantiating cell (parent cell).

Thus, a hierarchy of design objects is a set of cells such that the graph obtained by mapping cell definitions to nodes and parent-child relationships to directed edges is a directed, acyclic graph.

Note that non-geometric design objects are represented as the empty pointset with appropriate attributes. For example, a netlist can be viewed as a hierarchy of attributed empty pointsets. In a general sense a VLPT can be considered a function that maps a set of elements of H onto another set of elements of H, f: H t H.

Important properties of such a functions f included the concept of equivalence of elements in H and the transformation behavior of design objects under f.

The concept of equivalence, in contrast to identity, provides the means to differentiate between the actual representation ĥ of an element h∈H and its interpretation. For example, a GL/1 file and a GDS2 file may be different representations of a VLSI design.

Before discussing equivalence in more detail the configuration space H will be further characterized. The elements of H comprise geometric objects with associated attributes. Geometric objects may be formed recursively out of other geometric object.

The concept of pointsets in $R^2$ provides a consistent environment for geometry in the plane. The elements include the empty set and a single point. A rich set of mathematical tools is available in this environment.

Lines and polygons are innumerable sets of points represented by sets of equations. A pointset defined in coordinate space C1 may be placed into coordinate space C2 by the means of a coordinate transformation.

Despite the choice of representation, e.g., different coordinate spaces, different choices of equations, different hierarchical arrangements and different binary representations (GL/1, GDS2), any object in H defines a pointset in $R^2$.

The concept of attributes with associated semantics, e.g., corresponding operations on attributes for the operations on pointsets, completes the characterization of design objects.

Different applications need different concepts of equivalence to be maintained for the computation of a function $f$:H t H.

If the concept of composition maintains that performing the same operation on equivalent inputs produces equivalent output for every step in a composition of basic functions f and if the equivalence between sets of elements $H_1$, $H_2$ implies equivalence of the ordered elements of the sets, the discussion of equivalence may be reduced to the equivalence of the basic operations on single elements.

Pointset equivalence is a weak concept of equivalence compatible with VLSI layout processing. A layout is the description of the masks needed in the manufacturing process. Two design representations may be considered equivalent if they result in the same set of masks, e.g., if the pointsets of the flattened hierarchy are identical for all levels that influence mask creation.

A stronger concept of pointset equivalence requires that the flat pointsets are identical for all levels as they appear in the design representation. Some levels can be merged into a single mask level and other pointsets do not influence mask creation but device extraction etc. Pointset equivalence refers to this stricter definition.

As an example, the operation union, while dropping attributes on two pointset equivalent levels in different hierarchies and different pointset representations, produces two pointset equivalent levels.

Among the reasons for implementing more than pointset equivalence, results, e.g., design rule errors or LVS errors, presented in a different hierarchy than that of the input data make it difficult to apply these results, for example to correct the errors. In addition orientation can be difficult for a designer and hierarchy dependent software tools if a design modification, e.g., adding vias, alters the representation.

Hierarchical equivalence requires that the pointsets are identical per level within each cell of the design. It is possible to define partial hierarchical equivalence, e.g., hierarchical equivalence only for a subset of the levels or cells.

The propagation of attributes through operations is important for subsequent computations, e.g., netlist extraction relies on the propagation of net names through hierarchy adjustments.

With proper transformations defined for all attributes, either with a default policy or provided semantics, it is possible to establish equivalence under consideration of attributes. Attribute equivalence can be considered as two types, based on pointset equivalence and based on hierarchy equivalence.

Pointset and attribute equivalence requires that after flattening the hierarchy under application of the attribute semantics the pointsets are equivalent per level and that corresponding connected pointsets carry identical sets of attributes.

Hierarchy and attribute equivalence requires that within each cell and for each level pointsets are identical and the sets of attributes carried by corresponding connected pointsets are identical.

Representation equivalence is related to the actual representation of pointsets. A single connected pointset on a level may be represented by different sets of overlapping or abutting sub-pointsets. For example, a wire may be represented as a polygonalized line or a single polygon or a set of rectangles.

Note that the representation of a pointset is not directly influenced by alterations of the hierarchy, e.g., exploding an instance of a cell. Also note that representation equivalence implies pointset equivalence.

A strict form of equivalence would be the combination of hierarchical equivalence, attribute equivalence and representation equivalence. Again it is sometimes helpful to specify this strict equivalence only for a subset of the design, e.g., design objects for which a function f results in the identity operation.

Algorithms in computational geometry can be described for pointsets in the plane. Geometric operations in a VLSI processing engine are aware of boundary conditions for determining the aspect of hierarchy and the aspect of geometric decomposition.

The interactions that arise from boundary conditions can be characterized in four groups:

Touch: The intersection between the interacting pointsets is a point or a line.

Overlap: The intersection between the interacting pointsets has a finite, non-zero minimum width.

Distance: The intersection between the interacting pointsets is empty, but the minimum distance between the pointsets is below a certain threshold value. Various distance measurements may apply, e.g., the shortest path through a given pointset or shortest Euclidian distance.

Visibility: The intersection between the interacting pointsets is zero, but a straight line (with eventual constraints) can be drawn that connects the two interacting pointsets.

For any operation for which the union of evaluations on a set of pointsets is not equivalent to the evaluation of the unioned pointset, boundary conditions need to be considered for any partitioning that prohibits a determination of the flat connected pointsets before performing the actual geometric operation.

The scope of an interaction depends on the operation. It is sufficient to know the sequence of line segments in a pointset boundary along a separation line or the boundary of an overlap. An example for this case is connectivity. It is sufficient to know the interacting pointset up to a certain distance. With this additional knowledge it is possible to compute the correct partial result within the boundary. An example for this behavior is the computation of the Minkowski sum with a rectangle or octagon. The needed information cannot be bound by a distance from the boundary of the nested or separated shape. In this case it depends on topological information or connectivity. Thus, the entire set of objects related to the interaction is imported or the result of a computation performed on the related set of objects is imported. Such a set of design objects may for example be a net formed by electrical connectivity and an example for an operation is the computation of the area of all gates connected to the net.

It would be difficult to provide a standard mechanism that resolves boundary conditions for all possible operations on VLSI design objects. Thus, each individual operation needs to provide its own appropriate mechanism. But the majority of operations will be able to rely on a small set of standard mechanisms. Some examples include: redundant computation of overlapping boundaries with subsequent trimming based on the type of boundary, e.g., whether it is a geographic separation or a parent child relationship; exchange of additive properties across boundaries for connectivity based relationships, like 'is connected to a device'; and asymmetric fix up, e.g., the child cell determines its result regardless of context, while the parent cell modifies its native result to attach correctly to the native result of the child cell.

The interaction of rounding and boundary conditions is of particular interest because here is an opportunity to maintain important properties of the geometry without perfect arithmetic.

Consider a separation line that partitions a point set with general geometry, such that the intersection point of a boundary edge with the separation line is not on the grid defined by the coordinate representation. Depending on the property that should be preserved there are different choices, e.g., from both sides the same grid point is chosen on the separation line. This sacrifices angle and area and maintains topology. On an integer grid two parallel lines or a narrow angle may collapse, violating a 'Boolean' condition. In another example, the angle and parallelism may be preserved on a sufficiently fine grid while sacrificing connectedness.

While in the scenario of geometric decomposition a 'separation line' has two boundary environments, boundaries around cells may have an unlimited number of environments. Under the assumption of a fine grid and the preservation of Boolean expressions and connectivity the boundary condition established by a nested solution provides guidance for all the environments.

For the implementation platform (e.g., C, C++) of VLSI design processing systems, floating point arithmetic and integer arithmetic are directly provided by the implementation platform.

The implementation of computational geometry algorithms in integer arithmetic faces the problem of rounding errors. Elaborate methods for 'snapping' results onto the grid without the creation of topologically invalid configurations are needed. Even with a perfect mechanism to map results to the grid any chain of computations faces the accumulation of substantial rounding errors.

With floating point arithmetic the problem of accumulation of rounding errors is greatly reduced, but the small rounding errors inherent in floating point arithmetic invalidate important properties, e.g., identity of two values or parallelism of two line segments. Methods like separation bounds can be employed.

Libraries supporting rational numbers of unlimited size do not suffer from any of the two problems mentioned above. The performance of these libraries is one or two orders of magnitude below that of floating point and integer arithmetic.

Fixed point arithmetic appears as a compromise, in particular with the availability of 64 bit processors and operator overloading in C++. A fixed point arithmetic class that uses 48 bit for the integer part, 8 bits for fractional values and 8 bits as 'shift buffer' has a performance in the same league as floating point arithmetic, reduces rounding error accumulation by about two orders of magnitude and helps to preserve topological properties. For geometric configurations that are restricted to vertical, horizontal and diagonal (45 degree) line segments like some VLSI designs many geometric computations can be performed exactly in this form of arithmetic.

The concept of hierarchical graphs applies to VLSI designs. It captures the hierarchical nature of the design structure, cells in a design directly correspond to scopes. For an extracted netlist the leaf nodes correspond to nets, e.g., connected sets of pointsets. Internal nodes correspond to instances. Horizontal edges connect in a netlist graph normally with one end to a leaf node and with the other end to an internal node. The stub between a horizontal edge and an internal node A has an adjacent vertical edge that connects to a leaf node x in the graph represented by the internal node A. That leaf node x is a pin in A.

Figure 7B:
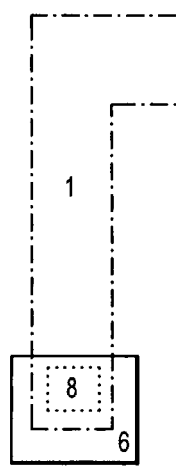
FIG. 7B is an illustration of a layout according to an embodiment of the present invention.
Figure 7B:
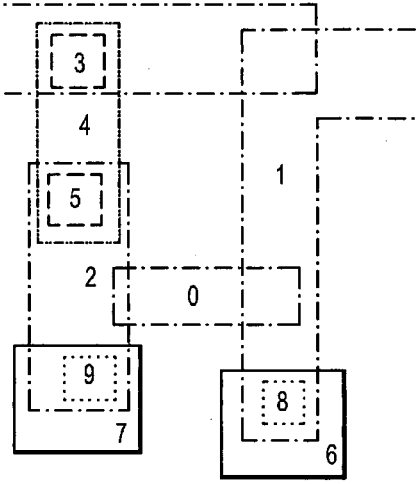
Figure 7C:
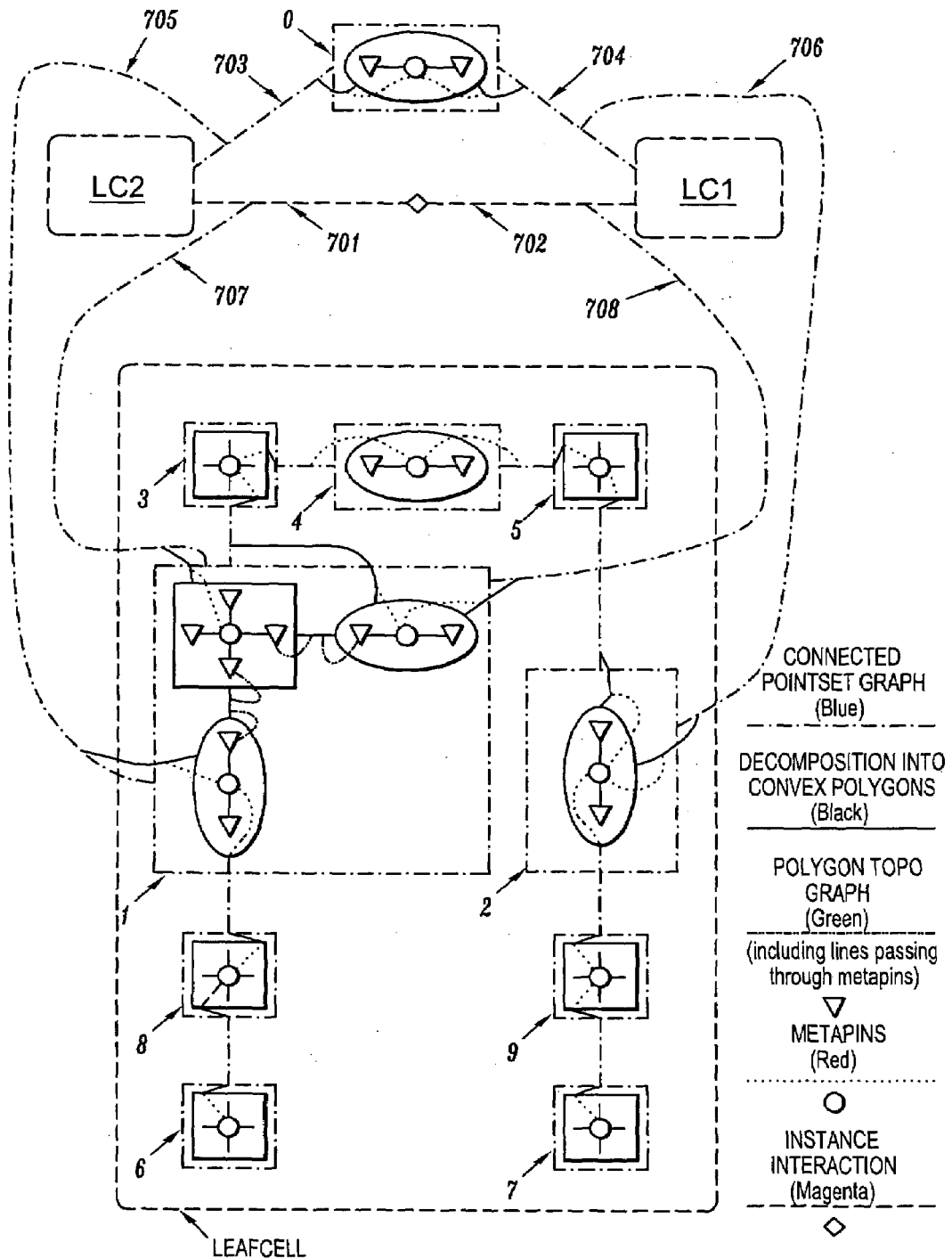
FIG. 7C is an illustration of a hierarchical graph showing objects and interactions according to FIG. 7B.

But there are more levels of detail a design processing engine need to be aware of. This section discusses one particularly useful mapping of a VLSI design to a hierarchical graph. The mapping is described top-down. Iterators present different views of the content of the structure. FIG. 7C shows an example of a hierarchical graph, FIG. 7B the corresponding layout.

FIG. 7C covers several levels of interaction. In this example all junctions are simple convex polygons. In the general case junctions may be comprising several simple convex polygons.

A VLSI design comprises cells and instances of those cells. This level of detail is reflected by the magenta components in FIG. 7C. The graph in the prime cell of the layout shown in FIG. 7B comprises two instance nodes for the instances LC1 and LC2. The interaction between the two instances needs a horizontal connection between the two instance nodes. Instead of using a single horizontal edge it is convenient to use a pair of horizontal edges 701 and 702 and a pseudo node (diamond) that reflects the interaction at the level of hierarchy where it occurs. Note that color references in the disclosure correspond to different lines in FIG. 7C.

The next level of detail partitions the content of a cell further. A cell contains besides other instances native maximum connected pointsets that reside on different levels or layers, shown as rectangles 0–9 in FIG. 7C.

Electrical connectivity partitions the levels in groups such that each group corresponds to a lithography mask. A subset of these groups form a linear order, such that a layer only connects to its direct predecessor and successor in this order. An example for such a level or layer stack is shown in FIG. 7B. Edges between rectangles 0–9, including edges 703 and 704, in FIG. 7C reflect the interactions establishing electrical connectivity, edges between rectangles 0–9 are horizontal, reflecting an intersection of pointsets within the same cell, and edges 705–708 and branches therefrom are vertical, reflecting an intersection of shapes in different cells.

There is a level of abstraction that is not directly shown in FIG. 7C, native nets. A native net is a connected subgraph formed by level interactions within a single cell. For example the shape 0 forms a native net and the entire content of LeafCell forms a native net.

There are two additional types of nets. A hierarchical net is the directed acyclic graph that is obtained if all hierarchical interactions of a native net within the same level of hierarchy and below are traversed, e.g., the traversal follows only stubs that connect to a lower level. A global net is the directed acyclic graph that is obtained if stubs are traversed up and down in the hierarchy for one instance of a native net. Both the hierarchical and the global nets are nested representations.

A valid hierarchy for a VLSI design has a single 'root cell', the root of the directed acyclic graph formed by its hierarchy that defines the coordinate system of the entire design. An instance that starts in this root cell defines a unique object in the flattened design. Such an instance is a path in the directed acyclic graph.

A partial instance does not start in the root cell. Such a partial instance describes a set of objects in the flattened design. This set contains as many elements as there are instances of the start cell of the instance path in the flattened design. Partial instances provide a mechanism for a nested representation of instance sets.

Consider a cell C and within this cell a level L. L defines a pointset in C. This pointset is further partitioned into maximal connected components $K_i$ as described above.

A single maximal connected component $K_i$ is further decomposed into rails and junctions. A rail is the largest rectangle such that: each longer side of the rectangle is subset of a line segment of the boundary of $K_i$; the medial axis skeleton (in Euclidian metric) contains a unique straight line segment which is defined through one connected pointset on each of the two longer sides of the rail; and the rail is a subset of Ki.

Let $J_i$ be the part of $K_i$ not covered by rails. Each maximal connected component of $J_i$ is a junction. Junctions are further decomposed into simple convex polygons, called base pointsets, rails are already base pointsets. In FIG. 7C the decomposition into rails and junctions is identical to the decomposition into simple convex polygons. Base pointsets forming junctions are shown as black rectangles and base pointsets forming rails as black ovals.

Corresponding to each base pointset is a graph with a metapin (red nodes) and terminal nodes (green nodes). An edge connects each terminal node with a corresponding metapin. Base pointsets have a terminal node for each line segment in their boundary, rails have only two terminal nodes for the two shorter line segments, the rail ends. Interactions that touch a line segment with a terminal node connect through a vertical edge the black stub to this green terminal node, all other forms of interaction connect to the metapin.

Note that the hierarchical graph comprising black, red and green elements that reside within a maximum connected component (e.g., within the blue rectangle 1) has two flat views. The views correspond to its two levels of abstraction, the base pointset level and the metapin terminal level.

The first flat view is the one of intersection/abutment between base pointsets. A base pointset corresponds to a node (e.g., black rectangle or black oval) and abutment corresponds to an undirected black edge. This view shows the higher level of abstraction.

The second view looks into the topology of the base pointsets. A node in this view corresponds to a terminal node or metapin and an edge corresponds to a terminal-metapin connection or a path formed out of two vertical edges (green or red edges) and black edges. Showing a green-black-green path in the view as one edge through an iterator, hides the grouping of base pointsets into maximum connected components.

The hierarchical graph with edges with stubs that may have stubs of their own is quite complex. This is the hierarchical view. Many applications are not interested in all details reflected in this representation.

Two different flat views have been described that are possible for a hierarchical graph with two levels of abstraction. This principle can be applied recursively, showing various flat or partially nested aspects while hiding other details of the hierarchical graph. Such derived views, e.g., particular ways to traverse the hierarchical graph, allow to expose only the level of detail that is needed for a particular application.

Note that while the example views discussed in the following are based on electrical connectivity as interaction, equivalent views maybe built based on any form of interaction that allows a proper definition of hierarchical graphs. An example would be a native net interaction based on a distance threshold instead of touch or a level stack that directly links two metal levels based on overlap.

The netlist view stops following 'stubs' at the level of native nets. LVS for example operates on the netlist view formed by electrical connectivity.

In the netlist view, internal nodes are instances of cells and devices and leaf nodes are native nets and device terminals, respectively. The type of an internal node is determined by the cell or device it represents. The netlist view is a bipartite graph between leaf nodes and internal nodes within a cell, although this is not directly needed by the hierarchical graph concept itself.

The 'stub' between a horizontal edge and an internal node A (i.e., an instance) connects to a vertical edge that connects to a net in the graph represented by A, the pin or port of the cell or the terminal of the device reflected by A, respectively.

The netlist view can be traversed in a nested fashion or virtually flat. A virtually flat traversal is based on an instance and hides the difference between intra- and inter-cell interactions, providing the appearance of the flattened netlist within the path of the instance the iteration is based on. Such an iteration may also be based on a partial instance.

In the example in FIG. 7C without an explicit graph level for the net structure a hierarchical net iterator traverses the blue subgraph formed by horizontal blue edges within one cell and presents this subgraph as a single native net node and the dashed edges applicable for the current instance leaving it as the edges leaving that net node. A virtually flat iterator based on a complete instance of any pointset in the example would present single flat net node.

The task of tracing text shorts to the actual pointset that causes the short needs a more detailed view than the netlist view. The next level of refinement below the netlist view is the connected pointset view. This graph representation reduces for example the computation cost for short tracing significantly by preserving the interactions found during net building, it also enables incremental computations depending on connectivity.

Every native net turns into an internal node of a new type, creating the connected component view. In this view, leaf nodes represent maximum connected pointsets within an individual native net on a single level. The adjacency expressed by an edge connecting to a leaf node is an inter level interaction.

This view may also be traversed hierarchical or in a virtually flat fashion, providing the appearance of the pointset in a flattened VLSI design.

In the example in FIG. 7C a virtually flat iterator would stop at every frame 0–9 as a node and present the outgoing edges applicable for the current instance as its edges, including blue-magenta-blue paths as single edges.

Eventually, the level of detail provided by the connected pointset view is not sufficient. Since wire structures are very common in VLSI designs partitioning of each maximum connected pointset into rails and junctions captures wiring structures. Former leaf nodes reflecting a connected pointset turn into internal nodes, the new leaf nodes are the rails and junctions.

In the example in FIG. 7c a virtually flat iterator would stop at every black frame, presenting solid black edges and black-blue-black paths and black-blue-magenta-blue-black paths as single edges.

A further decomposition of junctions into convex simple polygons is possible, allowing more detailed localization and helping geometric computations. Many algorithms, e.g., range searching, benefit from such a decomposition.

The nodes reflecting junctions turn into internal nodes in this view, leaf nodes are now rails (they are convex pointsets) and the base pointsets of the decomposition. The edges between base pointsets reflect line segments shared between boundaries of base pointsets.

In the example the virtually flat iterator performs the same traversal as in the rail and junction view since all junctions are convex.

Computations like finding the maximum distance within a net between two locations need a more detailed knowledge than the base pointset view. Knowledge about where two base pointsets interact is needed. This is reflected in the topological view for the case of abutment, a simple case of interaction.

In the topological view base pointsets turn into internal nodes. Leaf nodes are metapins and terminals. Note that a shared boundary that affects multiple line segments creates multiple edges connecting the terminals associated with the line segments involved.

In our example a virtually flat iterator would stop at the red and green nodes and would present green/red-black- . . . -black-green/red paths as single edges.

The scheme for hierarchy processing attempts to satisfy the following: take advantage of hierarchy adaptively, e.g., use intrusion information to choose processing path and style; efficiency for problem instances that are substantially flat; pipelining of computations to avoid large peak storage; and generation of independent subproblems for parallelism.

It is assumed that complex connected point sets are represented as a set of touching basic point sets whose boundaries are simple convex or shadow efficient polygons. Touching edges between basic point sets are vertical or horizontal. It may be beneficial if touching edges carry adjacency information to enable walk-based methods, but this is not necessary for scan line algorithms.

For all cells a least enclosing orthogonal pointset (LEOP) is determined that covers all levels. If the coverage of a cell shows significant differences between levels, LEOPs are determined on a by level basis. Basic point sets have the capability to report their least enclosing rectangle, which may be cached above a certain threshold for the number of vertices. These least enclosing rectangles of instances of basic point sets are also LEOPs. In most cases an LEOP will actually be a rectangle, even for LEOPs of cell instances.

Interactions between LEOPs within a given interaction scope are determined in the 'active' cell of the hierarchy. Examples for interaction scopes are direct intersection, location within a certain distance or visibility. The first active cell is the root cell, the mechanism is applied recursively as described below.

Interactions between native shapes are bundled into independent groups and each group is submitted for processing.

At this point the question arises about the mechanism that determines the interactions. Two potential candidates are a scan line and a search tree. For the example significant reasons encourage the use of a scan line: the cost of building a search tree with non-quadratic worst case complexity is in the same order of magnitude as sorting and scanning the elements; a search tree requires space proportional to the data while a scan line in the average will require space to the square-root of the data, as long as the individual pointsets are small compared to the entire design; and a scan line processes the data in a geographical order that can be exploited.

Thus, the following discussion focuses on a scan line based interaction search. The basic principle holds for search trees, but some of the pipelining mechanisms are not as natural due to the lack of geographical ordering.

The interactions between pointsets native to the root cells are determined directly with the progress of the scan line. Interactions that involve the LEOP of an instance are collected for this instance up to a certain threshold. Once the threshold is reached or the LEOP falls out of the scan line, the 'unique' results for this instance, e.g., the results depending on instance content and environment, are computed and placed in the parent cell.

The 'unique' part of the result of the interaction of the LEOP of an instance with its environment is determined by a small number of rectangles that cover an area of the LEOP/instance that is sufficient to complete the geometric computation. The number of rectangles allowed to express the area is either a small constant or proportional to the size of the instantiated cell.

The processing of the LEOP of an instance may encounter several cases: the LEOP has no interactions, in this case the result for the instance is entirely nested; and there is only a small number of interactions which cover only a minority of the area of the LEOP. In this case the instance will not be processed until all interactions are collected. Then a scan line is run across the instance to compute the unique part of the result and the instance is annotated with the rectangles covering the unique result.

The direction and starting point of the scan line and the 'length' of the scan line that actually stores interacting geometric objects can be limited by the description of the 'unique' area to minimize unnecessary scanning. In general interactions will occur at the border of the instance.

Furthermore there is the opportunity to gather interactions for more than one instance until the threshold is reached and to compute all unique results for several instances with a single scan through the child cell. There is a significant probability for similar coverage of instances, for example, forming a frame with eventual landing zones for pins.

For a small number of interactions that cover the majority of the area, the instance will also not be processed until all interactions are collected. The scan line computes the results for the unique part and eventually the entire result is placed in the parent, if the nested part is too small to provide a benefit.

Where there are a large number of interactions above the collection threshold, the scan line in the child is started before the scan line in the parent completely finished the instance. The unique results for the child are computed and placed into the parent cell.

Once the child scan line catches up to the parent scan line, the parent scan line moves ahead until the threshold is reached, then the child cell catches up again. Once the scan line in the child cell starts moving, the rectangles chosen to describe the unique areas have to be fixed. This may need to use a larger number of rectangles to describe the unique areas to avoid a second pass. The threshold is primarily there to avoid gathering too many interactions, e.g., a storage peak. Since only instances interacting with the scan line require holding of interactions at any given time, a moderate threshold should ensure that only large cells encounter this case, for which a larger set of describing rectangles is feasible.

Note that the unnesting on the fly for interactions with instances is applied recursively. As long as the interactions of instances with native geometric objects are below the threshold, the various steps in the hierarchy may be processed sequential. Cells above the threshold are large and thus the number of simultaneously operating scan lines will be small in the average case. When the scan line in the parent finishes, it leaves the following situation behind: all native results in the parent are computed and placed into the parent; orthogonal areas enclosing the unique results are computed by flattening on the fly and the results are placed into the parent cell, their level of interaction; no results were computed for areas of child cells that are not covered by any unique results; and traversing instances of a cell provides a partitioning into 'interacting' and 'non-interacting' regions for each instance. Combining these partitionings for multiple instances partitions the area of a cell into subareas. Each of these subareas may be characterized by the list of instances that covered it. For areas where this list does not contain all instances the nested result needs to be computed. Note that the detection of this condition only requires accounting in one number, no list.

For each encountered cell an eventually needed nested result is determined by a scan line analogous to the parent cell and the results are placed in this cell or the children, depending on their 'nestedness'.

The differential expressions attached to the instances allow to compose the correct result for each instance. A 'region exclusion' attached to an instance consists out of a rectangle and a level specification. Such an 'region exclusion' can be used easily as a filter in subsequent scan lines to feed the content of the scan line from the single cell that comprising the entire nested result. This allows the substantial prevention of actual cloning with moderate computation overhead, as long as the number of rectangles for exclusions per instance is kept small as suggested above.

In many VLSI designs there is a significant probability that a cell that is instantiated N times will see a number of environments much smaller than N. A LRU like caching scheme will reap the majority of the potential benefit. The most frequent environments are present in the cache with the highest probability and limiting the size of the cache prevents storage unnecessary storage peaks.

According to an embodiment of the present invention, a top down hybrid has the following properties: in the case of a computation whose result is mostly flat, it degenerates to a scan line with explosion on the fly where necessary; and in the case of a computation whose result is mostly nested, it becomes similar to an instance based approach, computing results nested were necessary. The slack compared to the shape instance method is the restriction that the unique parts of the result are approximated by regions instead of the exact instance set.

In the case of a true instance based approach with search trees the interior is investigated only once. But the 'avoidable' touching of interiors of cells comprises an iteration in a sorted list and a boundary check. Furthermore, for the case with the worst 'touch to computation' ratio, the gathering of interactions for more than one instance is possible within the threshold and reduces the overhead to a limit that is defined by the ratio of threshold to cell size, which may be made approximately a constant by estimating the cell content (number of vertices) by area. This should be in general a good measure, since layouts are tight to minimize area and have (artificially) uniform density for manufacturability.

The top-down approach avoids building search trees and collecting large amounts of intrusions using pipelining. The sequential access to the shapes in geometrically sorted order makes external data structures for geometry more efficient.

There are several natural independent sets formed, e.g., the instances for which all interactions may be gathered. Each of these becomes an independent subcomputation. Further, connected components of native point sets, approximations of which are obtained easily as the scan line moves on are natural independent sets. Additionally, large connected components may be broken into independent subsets by specifying appropriate boundary conditions such that the results fit together. Since the scope of evaluation is not limited by an ROI, each independent piece may look at the entire point set if needed, this allows for safe parallelization with dynamic load balancing, in particular on SMP machines.

Important to scalability of parallel processing is the minimization of bottlenecks that are created by sequential operations. This is already important for SMP implementations since locking is relatively expensive (e.g., hundreds of clock cycles for a lock transfer between processors). It is important for distributed operations, where the cost is about 3 orders of magnitude higher. This argues against a centralized control mechanism.

Furthermore it is important to exploit capabilities to their full extent. Mapping a distributed model to SMPs by simply passing information through sockets instead of the network degrades the SMPs to message passing machines. Their advantage, that a complex data structure that is expensive to build or copy can be handed over at constant cost, is lost in this case.

One way to evaluate parallelizing schemes is to consider the amount of serialized work in relation to the amount of parallel work. The effect of this ratio is captured in Amdahl's law. The theoretical minimum of serialized work for a given problem and data set is defined by its data dependencies. Deviations from this optimum are created by limitations of the communication mechanisms. Thus, the best 'return for investment' is achieved if an implementation exploits the inherent properties of the problem without trying to force an implementation into a paradigm.

Applied to a VLSI processing system, this leads to a three stage approach can be implemented, comprising task splitting, hierarchy aware zonewise parallelism, and opportunistic SMP parallelism.

For task splitting, static independencies partition the high level program describing the VLPT into independent sections. This allows distribution on multiple machines without communication except for a final consolidation.

For hierarchy aware zonewise parallelism, for larger flat tasks with distance bound interactions, a fixed partitioning scheme is possible. This allows also for distribution without communication except for a final consolidation. Compared to splitting it requires some redundant computation along the separation boundaries to resolve dependencies. For strongly nested tasks comprising several stages relying on reuse of intermediate results, an agent based dynamic distribution scheme can be used.

Opportunistic SMP parallelism allows the use of a finer granularity based on local and/or temporary independencies using multiple threads on an SMP machine. Any independent subtask, e.g., when sorting multiple sets, is executed as a separate thread. If at any time during the execution there are more threads active than processors available, this yields excellent load balancing.

Furthermore, this form of parallelism minimizes the need for locking if the code is optimized for it, since many subthreads operate on data whose temporary independence is known and thus not lock acquisition is necessary.

It is actually beneficial to use multiple threads even on a single processor machine. This allows to utilize I/O latencies for determination by decoupling communication and computation as far a possible. This involves for example starting the transmission of results before the entire result is completed:

For a combination of static partitioning, zonewise partitioning for code sections with limited interactions and SMP parallelism for the sections with more complex interactions yields good utilization of computing environments that contain at least a certain amount of SMP capabilities, either with a few smaller SMPs (4 or 8 processors) or one large SMP.

A dynamic distribution scheme comprising a network of interacting agents as described below will improve usability of environments with no or little SMP capabilities at the cost of increased complexity of the implementation.

An additional aspect is the availability of core memory. While the use of external data structures helps to reduce the core footprint significantly, projected design sizes and the cost of disk accesses require machines that have more than a 32-bit address space. A dynamic distribution scheme would provide more leverage to deal with computations that need more space than the majority of the available machines provide.

In the agent based distribution model each process constitutes an instance of the capabilities of the code. In particular each process is able to delegate subproblems by creating new processes and a process can initiate recombination with its creator.

Relationships between processes include, a parent-child relationship due to the recursive partitioning of the workload, and a relationship that results from the boundaries that were created by partitioning the work load.

Boundary relationships include a parent-child relationship that results out of the hierarchy of the design, e.g., a process was created to compute the nested result of a cell in the top-down scheme, and a relationship that results from geometric boundaries which are created by zonewise partitioning.

Any distributed communication scheme has to minimize communication. This involves controlling the quantity of data that is transmitted as well as the number of recipients the information is transmitted to. In other words, rather than widespread broadcasts communication should be localized. This has a strong correlation with minimizing the computational cost of consolidating the individual pieces of a partitioning, which depends on the information that influences more than one piece.

Each process in a distributed scheme has to communicate with all other processes it shares a boundary with. If processes are modeled as nodes and a shared boundary is modeled as an edge, this results in a graph in which the average degree of a node is a reasonably small constant.

Consider as an example a flat environment that is partitioned into tiles. Each tile shares boundaries with eight other tiles. In the top-down processing scheme an instance of a cell has a boundary to its parent that consists of a limited number of straight line segments.

From a certain point of view the connections of a cell which is handled by one process include links for all its instances. But nested information does not travel up the hierarchy. Only the instance specific components of the result of a computation on this cell travel up the hierarchy. Thus the quantification per instance appears to be more appropriate.

To exchange information between pieces of a computation a given algorithm has to provide methods to communicate across boundaries. The section on boundary conditions above discusses several classes of conditions that define different requirements of data flow. For example, the determination of the area of a net requires the transfer of area values across boundaries that are crossed by the net.

Parallelization uses the same boundaries as the top-down hierarchy scheme, either by exploiting the hierarchy or by partitioning geographically. But boundaries introduced through parallelization introduce an additional characteristic to the boundary, and that is the form of connection. Some boundary links have to transmit information through the network, others may have to transmit information between threads belonging to the same process on an SMP and finally there is a class of boundaries that exchanges information within the same thread like in a sequential run.

If each algorithm provides a generic API for information exchange across boundaries, different implementations depending on the communication medium can take maximum advantage out of the given environment. Most algorithms actually fall back to one of a few consolidation schemes on boundaries.

This scenario describes the behavior of an agent based distributed scheme.

Initially there is one process that loads the design data, streams them through eventual filters and translates them into a engine-specific stream of 'design objects'. Then it generates processes for the independent code sections and sends the engine-specific streams to these processes. It may actually filter the streams depending on the requirements of the code sections, e.g., by level.

This load scenario has several advantages compared to each process associated with a code section loading independently. No redundant parsing, translating and filtering. Input that is on a remote file server is pulled only once without forcing the user to copy first to a local place. This is particularly valuable if libraries or component formats like VIM are used. The latency for accessing multiple files occurs only once. Potential for filtering the stream, e.g., a process that works only on M1 does not read the entire design through the network.

Since the single reader can start writing the stream as it is generated it can take advantage of the fact that the local connection within a cluster of machines has higher throughput than the remote connection.

After loading a process is implemented for each statically independent code section and each process has the necessary data for the computation. While building the internal representation each process also has some initial information about the structure of the data. There may also some initial analysis to decide on a good partitioning strategy.

If a process finds that further partitioning appears beneficial, it generates further processes and transmits content to these processes. At this point the benefit of this loading and partitioning scheme is particularly obvious. N processors that independently load the design from a file server cause N times the design size in network traffic. If we assume that the partitioning has overlap that causes the sum of parts to be two or three times the design size, the benefit in reduction of total transmitted data grows with the number of participating machines.

In contrast to the type of creation of new processes that only needs concatenation of their independent results, in this stage siblings need to establish communication links that reflect the graph of their boundary interactions.

An important criterion for any distributed scheme that performs a series of steps with dependencies on intermediate results is the capability to avoid synchronization points, e.g., a complete consolidation with repartitioning.

Since computational cost in partitions changes from one intermediate step to the next, e.g., as hierarchy is lost, rebalancing of the load is needed. Thus, communication is needed to establish the recursive repartitioning and merging.

Each process or thread that is generated needs to know the processes/threads it potentially directly interacts with. The recursive repartitioning creates localization for this form of communication. The first independent process creates a moderate number p of new processes, which talk directly to each other and to their parent process. The parent process communicates with other processes of the initial distribution.

Any process that partitions its own workload further, applies this scheme recursively. The goal is choose subpartitions of the data in a fashion that they have minimal interactions with other processes then their parent, siblings and eventual children.

To keep this reasonable in complexity, the interaction should be defined as a set of orthogonal straight line boundaries and hierarchical interactions. The partitioning should rather clone than distribute small hierarchical entities with high instance counts.

Each individual process or thread, except opportunistic threads, has the full functional capability, it is an instance of the central class of the engine infrastructure. The design forms a hierarchical graph, interactions form edges in this hierarchical graph.

Consider a single operation (e.g., network connectivity analysis). In its local scope it creates and traverses edges. Each process has to know how to deal with its interactions with others. Traversing the graph obtains now one additional level of differentiation. There are edges that lead to 'other processes'. For each such edge it has to be known in which process the other end resides. Thus an assumed determination will have a methods that allow to ask the 'other end' for a particular result and methods to ask the 'other end' to provide a certain amount of information on the input to the task. Which one (or what combination) of these two mechanisms is used is up to the individual task.

This allows also different implementations for the communication depending on whether or not the two 'ends of an edge' reside on to threads of the same process or in different processes. No streaming of data is needed, just exchanging a pointer to the right place in the graph and making sure nobody writes while somebody else reads.

There is a compelling reason why this scenario will work correctly if any distributed model other than through deck splitting works correctly. Accordingly, to consolidate the results in any way the boundary conditions between 'pieces' of computation need to be defined well enough that the consolidated result is equivalent to a single-process result within the scope of equivalence that applies to that particular run even if a different model of parallelism is used.

Thus, even if a sequence of operations comprising complex interactions and dependencies of intermediate results, there is an opportunity to avoid a total consolidation for each intermediate step. Although sometimes consolidation and repartitioning may be better due to load balancing etc.

The dependencies between the different processes form something equivalent to a netlist. There is a hierarchical part due to the recursive self-partitioning and relationships between siblings.

Since partitioning is used to minimize interaction, in the average the number of direct communication partners of a piece should be some reasonable small constant (e.g., about 10).

Using external data structures, there is a chance to determine a job mostly in the core memories of multiple machines that does not fit into any of the machines memory. Only the initial analysis has to hold everything, but since that is a well defined and not too large task it is more likely to work efficiently with a relatively large disk to memory ratio.

Final consolidation for the output can traverse the pieces in a fashion that it can stream out the results while moving a 'front' of consolidation such that only the data around this front has to reside in memory.

Communication is distributed, and locality is created (no broadcast, no centralized 'whiteboard'). Paying attention to the network layout during distribution may actually avoid most of the hit of having machines in different subnets or on different switches or routers, although this is far fetched for standard distribution software.

There is some degree of dynamic load balancing even in the distributed mode.

As mentioned above, the mapping of geometry operations and hierarchy alterations is called to attribute transformations the semantics of an attribute.

Operations are partitioned on pointsets and with respect to their impact on attributes into the following classes.

Creation of new point sets and deletion of point sets.

Operations that compute multiple pointsets from one input pointset, e.g., partitioning of a pointset.

Operations that compute a single output pointset from multiple input pointsets, e.g., union of pointsets or difference.

Operations that compute a set of output pointsets from a set of input pointsets, that cannot be represented as a combination of 'single to many' and 'many to single' operations.

Operations that move a point set in the hierarchy, e.g., exploding an instance of a cell.

Most operations on pointsets are covered by one of these classes or a combination. The remaining operations form their own default class.

There are some corresponding operations on instances, e.g., creation and deletion of an instance and the moving of an instance in the hierarchy.

For each of these classes a set of attribute modifications is defined. For pure pointset operations the following set of modifications is provided: drop all attributes of input pointsets; set for each output pointset a provided set of attributes; set for each output pointset the set of attributes that is specified through a function that takes all input pointsets, all output pointsets and the target output pointset (including attached pointsets) together with the operation class as arguments. A special case of this is to keep one out of multiple attributes based on a criterion that is either predefined or computed as the smallest attribute with respect to a user-provided comparison function; and each output pointset carries all the attributes of all input pointsets.

Creation and deletion of an instance allows to set or drop associated attributes, e.g., an instance name.

Operations that move pointsets in the hierarchy have their own set of operations. Hierarchy modifying operations are generally split into two phases, moving content and adding or removing empty hierarchy elements.

For example the explosion of an instance of a cell can be considered as comprising the following operations: create a copy of the instantiated cell and change the instance that is exploded to an instance of the new cell. This new cell is now instantiated exactly once; move the content of the instantiated cell into the parent cell; and remove the now empty cell and its only instance.

A move in the hierarchy follows exactly one edge in the directed acyclic graph, general moves are created through composition. This reduces the number of operations to two base operations, a move to a parent or a move to a child cell. Now a user selection from a few predefined operations or a user defined function is applied to each of these operations. An example would be to concatenate the attribute with the instance and cell name of the child when moving a design object from a child to a parent cell, e.g., from an instantiated cell C to the cell P that contains the appropriate instance of C.

The operation is to read or write an attribute from or to a particular format, respectively.

To illustrate the attribute specification consider net names. The specification starts with a declaration of an attribute of the name netname and a basic type, in this case string. Methods in a higher level interface that handle attributes, e.g., the high level language, take the declared name as an argument. For example, string name=RetrieveAttribute('netname',<design object>);

The next component declares how a netname is represented in the file formats, e.g., for GL/1 with a certain opcode. This information has to be evaluated by import/export filters to translate the internal representation of netname correctly.

Next the operations are selected for each class of operation:

Move to parent: Concatenate with instance name and cell name of the source with delimiter/.

Move to child: Concatenate with instance name of target and cell name of source with delimiter\. If there are two complementing concatenations, remove both.

Single split to many: All output pointsets obtain the net name. For example if shrinking fragments a pointset.

Many merged to single: Obtains all net name attributes out of the set that originated at the highest level of hierarchy, in correct designs there should be only one such net name present, otherwise this constitutes a text short. The original level of hierarchy can be computed from the chain of concatenations.

Many into many: Each output pointset obtains all attributes of all input pointsets that intersect the output pointset, together with issuing a warning statement. If the output of such an operation is used as input to a netbuild, text shorts will not be lost with the policy used, but text opens may be lost. This policy can provide coverage for an error in the high level program containing the netbuild.

Default operation: Drop attributes with warning message.

The above set of policies propagates attributes appropriately for a typical 'pre-netbuild' scenario that explodes instances and merges nets. If operations are performed for which the correctness of the attribute propagation cannot be ensured, either opens or shorts are generated or warnings are issued during the execution about potential loss of attribute information.

VLSI processing tasks are interested in identifying and analyzing structures. One example is the extraction of devices, e.g., a complementary metal oxide semiconductor (CMOS) transistor or resistor. Another example is the identification of topological structures, e.g., wires forming coils or loops. Other applications are interested in the way a net distributes a single connection to multiple connections, e.g., if there is single junction with one incoming wire and eight outgoing wires or if there is a tree of one-to-two junctions.

Almost all of the interesting structures can be defined as a hierarchical graph based on relationships between pointsets. This section discusses some examples.

The relationships available for graph definition can be partitioned into several classes. There are structures within a connected pointset that reflect its topology, there are interactions between levels and there are combinations of multiple interactions.

The decomposition into rails and junctions of maximum connected components provides a basis to identify structures in pointsets, e.g., coils and distribution trees.

This form of topology graph captures several interesting aspects: the concept of a straight wire; the direction of a wire and of change of direction (a junction node of degree 2); the concept of merging of forking of wires; and the concept of loops in wires and of higher order connectivity in networks.

An induction coil is for example described by an alternating sequence of rails and junctions with degree two such that all junctions change direction by the same angle, e.g., all by 90 degrees clockwise.

The interaction between levels defines a relationship between the 'single color' graphs that reflect the connected components on a single level. For example, a via on $V_1$ intersecting with a point set on $M_1$ constitutes a graph of a different color. The interactions between the two graphs define 'blue-red' vertices.

Figure 8:
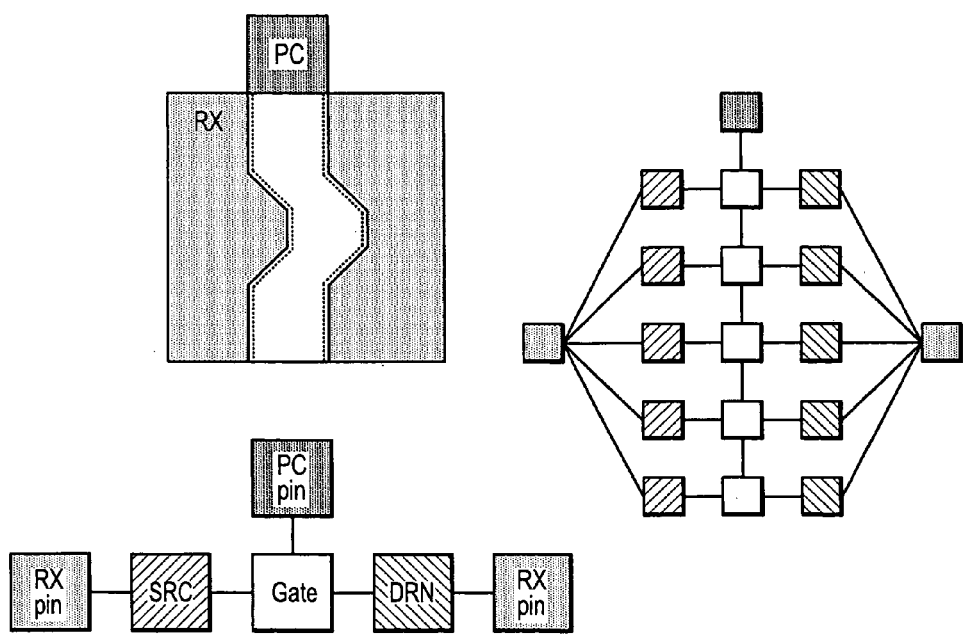
FIG. 8 is an illustration of a field effect transistor according to an embodiment of the present invention.

Devices form more complex interactions that are comprising pointset interactions and topological structure. FIG. 8 shows a simple FET and two possible corresponding graphs. The length of the edge sequences corresponding to source and drain defines the device width and some measure of the varying distance between the two edge sequences defines the device length.

If the structure of the bent gate is considered, it may for example be decomposed into 5 convex subcomponents with different physical properties. So a device is nothing else than a combination of topological properties (convexness, direction, connectedness) with level interactions in a specific form that results in a three vertex or 15 vertex graph.

The most powerful aspect of graphs is their generality. Almost everything from biochemical processes to network routing can be mapped onto general graph problems. Thus, providing in the tool a mechanism that allows to define vertices and edges and to use subsequently graph algorithms to compute measurements or properties opens a new level of functionality.

The examples above show a direction for such definitions, the association of point sets with vertices and edges. For example, in the case of the FET three point sets, the PC-RX-intersection and two edge-sequences of its boundary form vertices and their adjacencies form edges. If these point sets are partitioned by decomposing the gate area into convex regions using line segments that connect the two critical boundary edge sequences, the resulting point sets and their adjacencies are the basis for the more detailed graph.

Many graph algorithms operate with the concept of collapsing subgraphs into vertices or the opposite. This concept is in the VLSI world most prominently represented by the concept of hierarchy. Thus, allowing the construction of hierarchical graphs by defining rules for expanding and collapsing enables programs to choose the level of detail and complexity they need to see.

The following pseudocode gives an example for the mapping of geometry to a graph, namely the simple device graph of our FET. In this case connected components of pointsets are mapped to vertices and the relationship is subset of creates the edges.

```
GATE = intersection (RX,PC);
DIFF = difference (RX,PC);
SRCDRN = intersection(boundary(GATE),DIFF);
GRAPH{
    Vertex(A) : ConnectComponent(GATE);
    Vertex(B) : ConnectComponent(SRCDRN);
    Vertex(C) : ConnectComponent(DIFF);
    Edge(A,B) : SRCDRN subset of GATE;
    Edge(B,C) : SRCDRN subset of DIFF;
}
FET {
    Vertices(v1=A,v2=B,v3=B,v4=C,v5=C);
    Edges([v1,v2],[v1,v3],[v2,v4],[v3,v5]);
    Symmetry([v2,v4]<->[v3,v5]);
}
```

The definition of a device with swappable pins is now simply the specification of a specific graph together with generating elements of its symmetry group. Note that a permutation of v2 with v3 is only allowed while simultaneously swapping v4 and v5. If no symmetry is specified, the device is non-swappable. An assignment which vertex is source and which is drain is possible through appropriate expressions, e.g., using attributes of the connectivity.

It is not difficult to extend the graph specification to describe classes of graphs, e.g., by allowing several multiple isomorphic subgraphs to be connected in parallel or in series.

Having described embodiments for a system and method for VLSI design, it is noted that modifications and variations can be made by persons skilled in the art in light of the above teachings. It is therefore to be understood that changes may be made in the particular embodiments of the invention disclosed which are within the scope and spirit of the invention as defined by the appended claims. Having thus described the invention with the details and particularity required by the patent laws, what is claimed and desired protected by Letters Patent is set forth in the appended claims.

What is claimed is:

1. A computer-implemented method for hierarchical very large scale integration design comprising:
    representing a structure of the hierarchical very large scale integrated design as a graph comprising design objects;
    specifying a transformation behavior applied to the design objects;
    processing, top-down, the graph to perform the transformation behavior on the hierarchical very large scale integrated design; and
    outputting a transformed hierarchical very large scale integrated design.

2. The computer-implemented method of claim 1, wherein the processing further comprises searching for an isomorphic structure.

3. The computer-implemented method of claim 1, wherein the graph describes a plurality of scopes.

4. The computer-implemented method of claim 1, wherein the graph is based on a pointset interaction between structures of the hierarchical very large scale integration design.

5. The computer-implemented method of claim 1, wherein the graph is based on symmetry groups between structures of the hierarchical very large scale integration design, wherein the graph represents a circuit substructure.

6. The computer-implemented method of claim 1, wherein an attribute is attached to a design object, the attribute having a user-defined mapping between an attribute transformation and a design object transformation.

7. The computer-implemented method of claim 1, wherein processing, top-down, comprising transferring information from a child graph to a parent graph, wherein a node in the parent graph represent an instance of the child graph.

8. The computer-implemented method of claim 1, wherein processing, top-down, the graph comprises resolving boundary conditions, recursively, by adjusting a parent cell, beginning with a root cell of the graph.

9. The computer-implemented method of claim 8, wherein each cell is represented by a plurality of connected least enclosing orthogonal pointsets.

10. The computer-implemented method of claim 9, further comprising:
    determining an interaction between the least enclosing orthogonal pointsets; and
    determining a decomposition of the cell according to the interaction.

11. The computer-implemented method of claim 10, wherein processing, top-down, further comprises cloning by expression using a result of the decomposition to produce a cell definition.

12. The computer-implemented method of claim 1, wherein representing the structure of the hierarchical very large scale integration design as the graph comprising design objects further comprises determining a plurality of scopes, wherein each scope comprises an internal node and a leaf node.

13. A program storage device readable by machine, tangibly embodying a program of instructions executable by the machine to perform method steps for hierarchical very large scale integration design, the method steps comprising:
    representing a structure of the hierarchical very large scale integrated design as a graph comprising design objects;
    specifying a transformation behavior applied to the design objects;
    processing, top-down, the graph to perform the transformation behavior on the hierarchical very large scale integrated design; and
    outputting a transformed hierarchical very large scale integrated design.

14. The method of claim 13, wherein the processing further comprises searching for an isomorphic structure.

15. The method of claim 13, wherein the graph describes a plurality of scopes.

16. The method of claim 13, wherein the graph is based on a pointset interaction between structures of the hierarchical very large scale integration design.

17. The method of claim 13, wherein the graph is based on symmetry groups between structures of the hierarchical very large scale integration design, wherein the graph represents a circuit substructure.

18. The method of claim 13, wherein an attribute is attached to a design object, the attribute having a user-defined mapping between an attribute transformation and a design object transformation.

19. The method of claim 13, wherein processing, top-down, comprising transferring information from a child graph to a parent graph, wherein a node in the parent graph represent an instance of the child graph.

20. The method of claim 13, wherein processing, top-down, the graph comprises resolving boundary conditions, recursively, by adjusting a parent cell, beginning with a root cell of the graph.

21. The method of claim 20, wherein each cell is represented by a plurality of connected least enclosing orthogonal pointsets.

22. The method of claim 21, further comprising:
determining an interaction between the least enclosing orthogonal pointsets; and
determining a decomposition of the cell according to the interaction.

23. The method of claim 22, wherein processing, top-down, further comprises cloning by expression using a result of the decomposition to produce a cell definition.

24. The method of claim 13, wherein representing the structure of the hierarchical very large scale integration design as the graph comprising design objects further comprises determining a plurality of scopes, wherein each scope comprises an internal node and a leaf node.

25. A computer-implemented method for hierarchical very large scale integration design comprising:
representing a structure of the hierarchical very large scale integrated design as a graph comprising design objects;
specifying a transformation behavior applied to the design objects;
processing the graph top-down beginning with a root cell of the graph to perform the transformation behavior on the hierarchical very large scale integrated design, wherein the transformation behavior resolves a boundary condition of the hierarchical very large scale integrated design by performing a move operation, a split operation or a merge operation to adjust the structure of the hierarchical very large scale integrated design; and
outputting a transformed hierarchical very large scale integrated design.

26. The computer-implemented method of claim 25, wherein each cell is represented by a plurality of connected least enclosing orthogonal pointsets, the computer-implemented method further comprising:
determining an interaction between the least enclosing orthogonal pointsets; and
determining a decomposition of the cell according to the interaction.

27. The computer-implemented method of claim 26, wherein processing, top-down, further comprises cloning by expression using a result of the decomposition to produce a cell definition.

* * * * *